(12) United States Patent
Tseng et al.

(10) Patent No.: US 6,335,260 B1
(45) Date of Patent: Jan. 1, 2002

(54) METHOD FOR IMPROVING THE DIMPLE PHENOMENA OF A POLYSILICON FILM DEPOSITED ON A TRENCH

(75) Inventors: Mao-song Tseng, Hsinchu; Rong-ching Chen, Taichung; Chin-lin Lin, Pan Chiao; Su-wen Chang, Hsinchu, all of (TW)

(73) Assignee: Mosel Vitelic Inc., Hsinchu (TW)

( * ) Notice: Subject to any disclaimer, the term of this patent is extended or adjusted under 35 U.S.C. 154(b) by 59 days.

(21) Appl. No.: 09/627,136

(22) Filed: Jul. 27, 2000

(30) Foreign Application Priority Data

Mar. 23, 2000 (TW) .............................. 89105409 A (51) Int. Cl.$^7$ .............................. H01L 21/76; G03F 7/00
(52) U.S. Cl. .......................... 438/430; 216/47; 430/313; 430/314
(58) Field of Search .................... 438/430, 424; 216/17, 47; 430/311, 312, 313, 314, 315, 316, 317

(56) References Cited

U.S. PATENT DOCUMENTS

| | | | | |
|---|---|---|---|---|
| 4,671,970 A | * | 6/1987 | Keiser et al. | 156/643 |
| 5,126,231 A | * | 6/1992 | Levy | 430/313 |
| 5,587,090 A | * | 12/1996 | Belcher et al. | 216/17 |
| 5,770,336 A | * | 6/1998 | Choi | 430/5 |
| 5,906,910 A | * | 5/1999 | Nguyen et al. | 430/311 |
| 6,150,256 A | * | 11/2000 | Furukawa et al. | 438/618 |

* cited by examiner

Primary Examiner—Charles Bowers
Assistant Examiner—David S. Blum
(74) Attorney, Agent, or Firm—Bacon & Thomas, PLLC (57) ABSTRACT

In the invention, a photoresist layer is first spread on a semiconductor structure, and then using a photomask with a specially designed pattern exposes the photoresist layer. Next, the photoresist layer is developed to form a patterned photoresist layer. Thereafter, using the patterned photoresist layer as a mask, a trench is formed in the semiconductor structure by selective etching. The pattern of the photomask according to the invention is formed as in the following steps. At first, a first pattern extending in a first direction and having a first side and a second side that is opposite to the first side is formed. Next, a second pattern extending in a second direction that is perpendicular to the first direction is formed in such a way that an end of the second pattern is connected with the first side of the first pattern. Thereafter, a concave edge is formed on the second side to substantially face the second pattern. The distance between the first side and the second side is shortened due to the presence of the concave edge. As a result, the depth of the dimples developed at the intersection points of the dimple lines is greatly reduced when a polysilicon layer is deposited on the trench formed according to the invention.

20 Claims, 7 Drawing Sheets

METHOD FOR IMPROVING THE DIMPLE PHENOMENA OF A POLYSILICON FILM DEPOSITED ON A TRENCH

FIELD OF THE INVENTION

The invention relates to a method for improving the dimple phenomena of a polysilicon layer. More particularly, the invention relates to a method for improving the dimple phenomenon of a polysilicon layer deposited on a trench consisting of a plurality of substantially T-shaped trench cells. Each of the substantially T-shaped trench cells includes a stick portion for accommodating a transistor cell and a bar portion for accommodating a gate bus.

BACKGROUND OF THE INVENTION

In advanced semiconductor integrated circuits (ICs), a trench structure is widely used to achieve various objectives. For example, the trench structure is used to form a deep trench capacitor whose capacitance increases with an increase in the longitudinal surface area of a dielectric so as to enlarge the integration of semiconductor ICs. Moreover, the trench structure is used to form a trench isolation for isolating semiconductor devices in semiconductor ICs so as to improve problems of the conventional LOCOS process such as the formation of so-called bird's beaks which occupy a larger amount of the surface area of the substrate, the occurrence of a less planar surface, and so on. In addition, the trench structure is also used to form a double diffused MOS transistor (DMOS), wherein a MOS transistor is formed within the trench, for applying high power ICs. With respect to the high power ICs, a trench consisting of a plurality of substantially T-shaped trench cells is usually employed because it is necessary to form many MOS transistors connected in parallel through out the trench. Each of the substantially T-shaped trench cells includes a stick portion for accommodating a transistor cell and a bar portion for accommodating a gate bus.

In a conventional method for manufacturing high power ICs, however, a serious dimple phenomenon typically occurs in a polysilicon film deposited on the trench consisting of the substantially T-shaped trench cells. Hereafter described in detail is the serious dimple phenomenon formed in the polysilicon film according to the conventional method for manufacturing the high power IC with reference to FIG. 1 to FIGS. 5(A) and 5(B).

Figure 1:
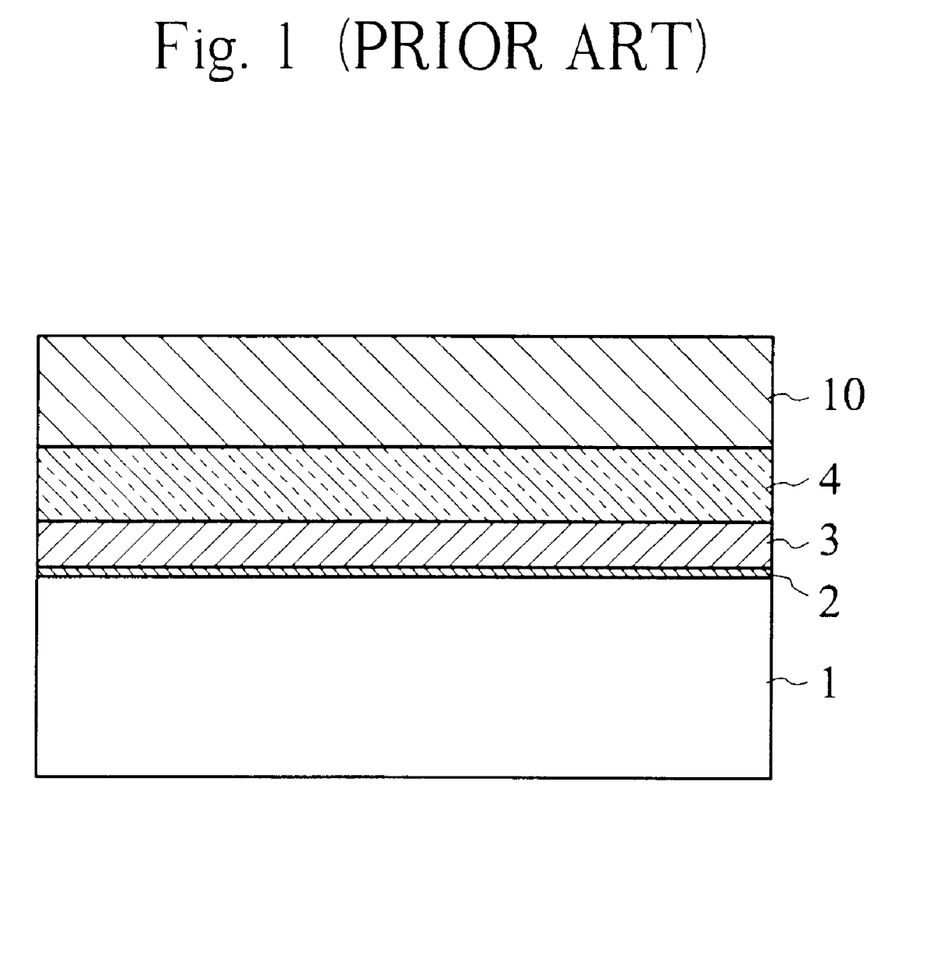
FIG. 1 is a cross-sectional view showing a semiconductor structure.
Figure 2A:
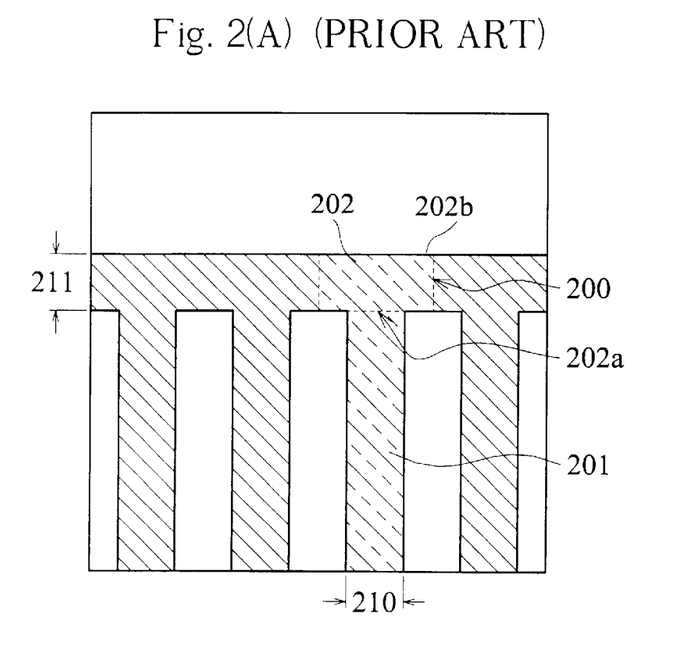
FIG. 2(A) is a plane view showing a conventional photomask pattern for forming a trench.

FIG. 1 is a cross-sectional view showing a semiconductor structure. FIG. 2(A) is a plane view showing a conventional photomask pattern for forming a trench. Referring to FIG. 1, at first, a semiconductor substrate 1 such as silicon is prepared. Next, a pad oxide layer 2 made of silicon oxide, a silicon nitride layer 3, and a mask oxide layer 4 made of silicon oxide are sequentially formed on the semiconductor substrate 1 by a conventional heat treatment or a chemical vapor deposition (CVD) process. Thereafter, a photoresist layer 10 is substantially uniformly coated on the mask oxide layer 4. Subsequently, using a photomask with the conventional pattern shown in FIG. 2(A), the photoresist layer 10 is exposed so as to transfer the photomask pattern into the photoresist layer 10 as a latent pattern. Then, the exposed photoresist layer 10 is developed to form a patterned photoresist layer (not illustrated).

In the conventional photomask pattern shown in FIG. 2(A), the photomask pattern for forming a trench consists of a plurality of substantially T-shaped pattern cells 200. Each of the substantially T-shaped pattern cells 200 includes a stick portion 201 and a bar portion 202, in which the width 210 of the stick portion 201 is equal to the width 211 of the bar portion 202. The bar portion 202 extends in a direction referred to as x while the stick portion 201 extends in another direction, referred to as y, being perpendicular to the x direction. Furthermore, the bar portion 202 has a first side 202a connected with the stick portion 201, and a second side 202b located opposite to the first side 202a. Moreover, two adjacent T-shaped pattern cells 200 are connected at the respective bar portions 202. As mentioned above, in the high power ICs, each of the stick portions 201 of the conventional photomask pattern for forming a trench is used to accommodate a MOS transistor cell, and the bar portions 202 are used to accommodate a gate bus, through which each of the MOS transistor cells is connected in parallel. It should be noted that although two rectangular corners are constructed at each of the intersections of the stick portions 201 and the bar portions 202 in the conventional photomask pattern shown in FIG. 2(A), the developed patterned photoresist film is actually shown in FIG. 2(B), and the condition shown is due to the effects of optical interference and diffraction during the exposure process. More specifically, each of the rectangular corners is dulled by the effects of optical interference and diffraction, and therefore the patterned photoresist layer after being developed, shown in FIG. 2(B), has two rounded corners at each of the intersections of the stick poritons 201 and the bar portions 202.

Figure 2B:
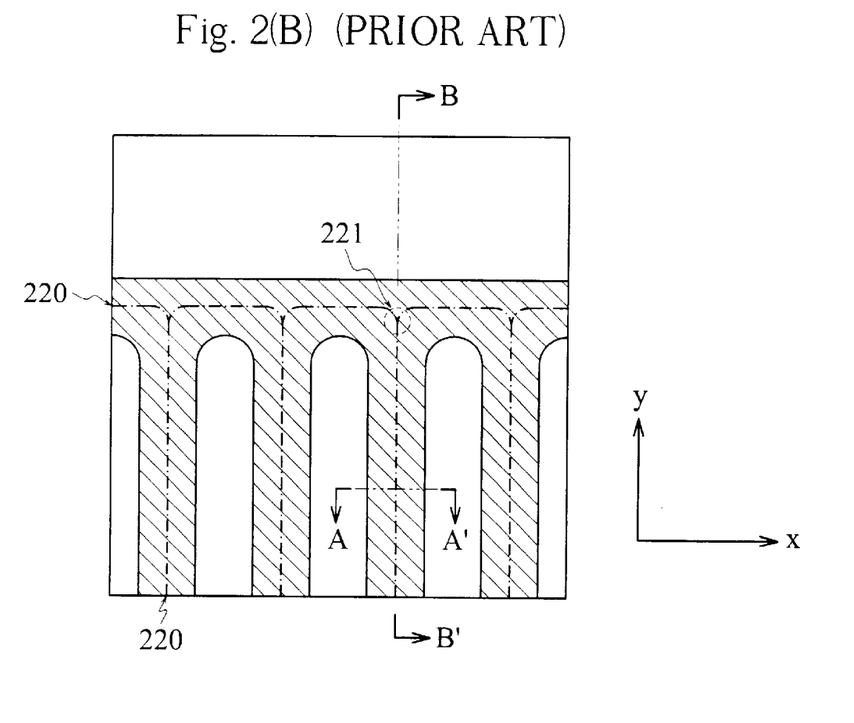
FIG. 2(B) is a plane view showing a patterned photoresist layer after exposed and developed by using the photomask pattern shown in FIG. 2(A)
Figure 3A:
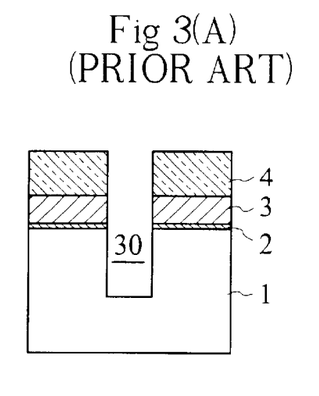
FIG. 3(A) is a cross-sectional view showing a structure of the trench, after an anisotropic etching, along a line A–A' of FIG. 2(B)
Figure 3B:
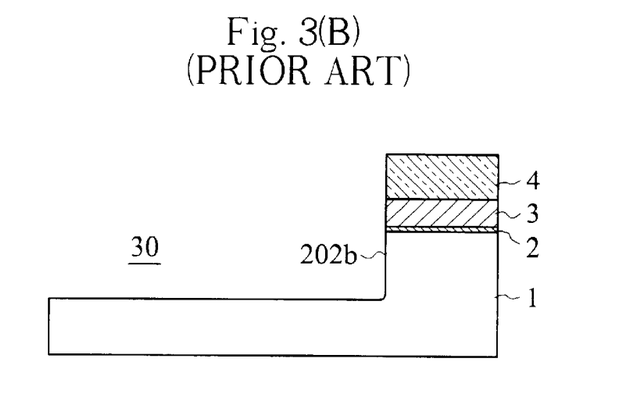
FIG. 3(B) is a cross-sectional view showing a structure of the trench, after an isotropic etching, along with a line B–B' of FIG. 2(B)

Subsequently, using the patterned photoresist layer as shown in FIG. 2(B) as a mask, the mask oxide layer 4, the silicon nitride layer 3, the pad oxide layer 2, and the semiconductor substrate 1 are selectively etched so as to form a trench 30 by the process of anisotropic dry-etching for example, plasma etching or reactive ion etching. FIG. 3(A) is a cross-sectional view showing a structure of the trench, after the anisotropic etching, along a line A–A' of FIG. 2(B) while FIG. 3(B) is a cross-sectional view showing a structure of the trench, after the anisotropic etching, along with a line B–B' of FIG. 2(B). Note that the patterned photoresist layer used as the mask has been removed in FIGS. 3(A) and 3(B).

Figure 4A:
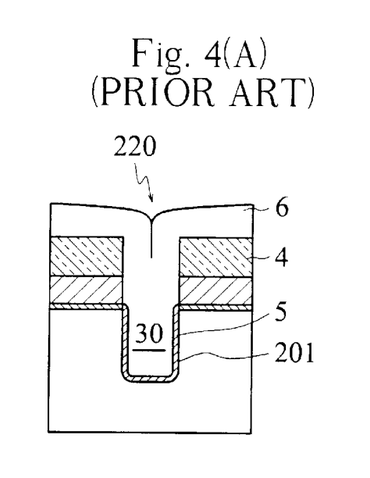
FIG. 4(A) is a cross-sectional view showing a structure of the trench, after a polysilicon layer is deposited, along a line A–A' of FIG. 2(B)
Figure 4B:
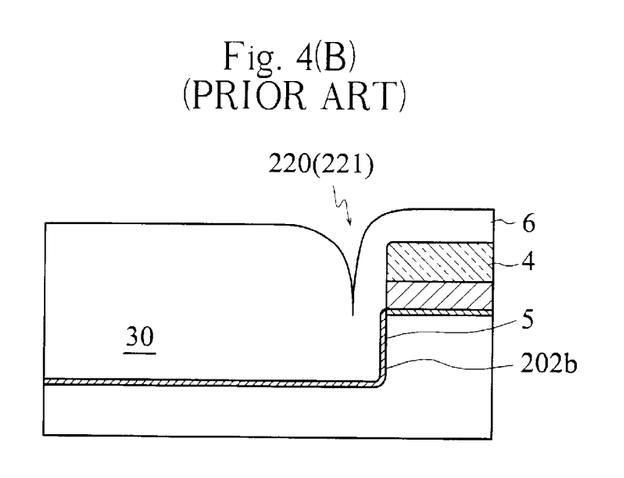
FIG. 4(B) is a cross-sectional view showing a structure of the trench, after a polysilicon layer is deposited, along with a line B–B' of FIG. 2(B)

Referring to FIGS. 4(A) and 4(B), as a gate oxide layer, a thin silicon oxide layer 5 is formed to cover the surface of the trench 30. Next, the trench 30 is overfilled with a polysilicon layer 6 by the process of chemical vapor deposition. In addition, the deposited polysilicon layer 6 also covers the unetched surface of the mask oxide layer 4. During the process of depositing the polysilicon layer 6, a plurality of dimple lines 220 develop on the polysilicon layer 6 after a predetermined deposition period because the polysilicon layer 6 is deposited from the bottom surface and sidewalls of the trench 30 upwards, that is, from the edges of the trench pattern as shown in FIG. 2(B). Each of the plurality of dimple lines 220 is substantially located along the symmetric center of the corresponding stick portion 201 or bar portion 202. More specifically, with respect to stick portions 201 of the T-shaped trench cells, the polysilicon layer 6 is deposited from the sidewalls of the stick portions 201 upwards, as shown in FIG. 4(A). Therefore, the dimple lines 220 are developed along the symmetric centers of the stick portions 201 after the completion of the depositing. With respect to the bar portions 202 of the T-shaped trench cells, similarly, the dimple lines 220 are developed along the symmetric centers of the bar portions 202 after the completion of the depositing, as shown in FIG. 4(B). It should be understood that the dimple lines extending in the direction x intersect with the dimple lines extending in the direction y at dimple intersection points 221. As compared with any other points of the dimple lines 220, the dimple intersection points 221 are located the farthest from the sidewalls of the trench 30. As a result, the deepest dimples are developed at the dimple intersection points 221 when the deposition of the polysilicon layer 6 is completed, as shown in FIG. 4(B). In other words, the thickness of the polysilicon layer 6 in the vicinity of the dimple intersection points 221 is the thinnest. The dimple phenomenon at the dimple intersection points 221 causes several problems during the succeeding processes in such a way that it is impossible to fabricate the desired high power ICs.

Figure 5A:
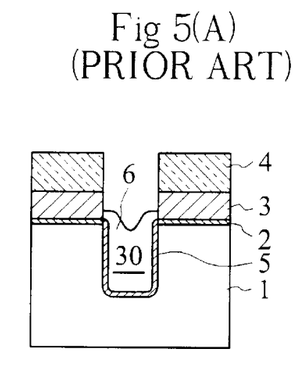
FIG. 5(A) is a cross-sectional view showing a structure of the trench, after the polysilicon layer is etched back, along a line A–A' of FIG. 2(B)
Figure 5B:
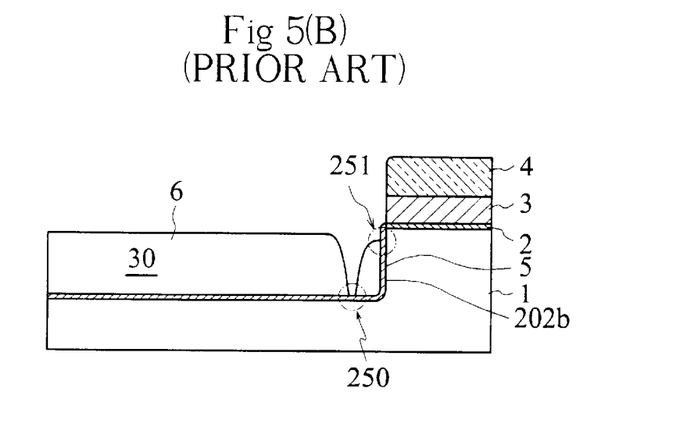
FIG. 5(B) is a cross-sectional view showing a structure of the trench, after the polysilicon layer is etched back, along with a line B–B' of FIG. 2(B)

These problems during the succeeding processes caused by the dimple phenomenon at the dimple intersection points will be described in detail below with reference to FIGS. 5(A) and 5(B). After the deposition of the polysilicon layer 6 is completed, it is necessary for a portion of the polysilicon layer 6 deposited on the mask oxide layer 4 to be removed by the process of etching, and for the portion deposited within the trench 30 to be etched back to form a recess having a predetermined depth. FIG. 5(A) is a cross-sectional view showing the structure of the trench 30 after the etching of the polysilicon layer 6 is completed, along a line A–A' of FIG. 2(A), while FIG. 5(B) is a cross-sectional view showing the structure of the trench 30, after the etching of the polysilicon layer 6 is completed, along a line B–B' of FIG. 2(B). It is observed from FIG. 5(B) that, during the process of the etching, the polysilicon layer 6 in the vicinity of the dimple intersection points is completely removed due to its thinness, resulting in the portions 250 of the thin silicon oxide layer 5 located on the bottom surface of the trench 30 being exposed. Consequently, the polysilicon layer 6 located within each of the bar portions 202 of the trench 30 is divided into two separate parts, and it is needless to say that this structure is not applicable for fabricating the high power ICs. Furthermore, the other portions 251 of the thin silicon oxide layer 5 covering the semiconductor substrate 1 may be exposed, as shown in FIG. 5(B).

Figure 6A:
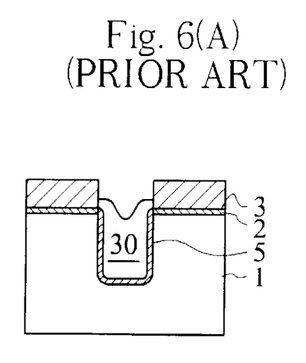
FIG. 6(A) is a cross-sectional view showing a structure of the trench, after a mask oxide layer is removed, along a line A–A' of FIG. 2(B)
Figure 6B:
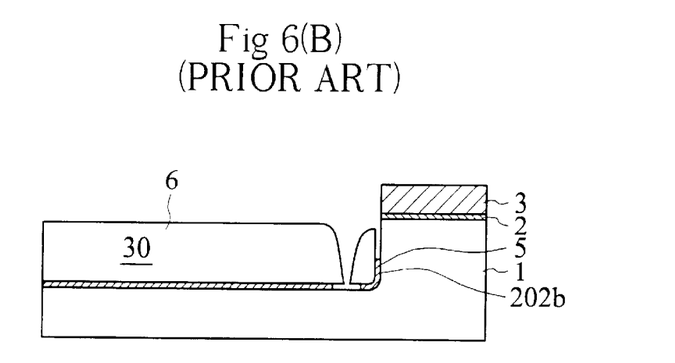
FIG. 6(B) is a cross-sectional view showing a structure of the trench, after a mask oxide layer is removed, along with a line B–B' of FIG. 2(B)

Referring to FIGS. 6(A) and 6(B), the unnecessary mask oxide layer 4 is then removed by the process of etching using hydrofluoric acid (HF) as an etchant. During the process of HF etching, however, the portions 250 and 251 are also removed because the polysilicon layer 6 does not cover, and therefore protect, them as mentioned above, resulting in the structure shown in FIG. 6(B). Due to a lack of separation by the thin silicon oxide layer 5, the polysilicon layer 6 and the semiconductor substrate 1 are connected to each other resulting in a short circuit. Therefore, this semiconductor structure is not applicable for fabricating the high power ICs.

In view of the foregoing problems, it is desirable to provide a method for improving the dimple phenomena of a polysilicon film deposited on a trench.

SUMMARY OF THE INVENTION

Therefore an object of the present invention is to provide a method for improving the dimple phenomena of a polysilicon film deposited on a trench, thereby decreasing the depth of a dimple developed at a dimple intersection point.

Another object of the present invention is to provide a method for improving the dimple phenomena of a polysilicon film deposited on a trench, thereby fabricating a structure of a semiconductor trench being suitable for the high power ICs.

In the present invention, the improvement of the dimple phenomena is achieved by using a mask with a pattern designed specially. According to a first aspect of the present invention, a method for forming a mask used to improve the dimple phenomena comprises the following steps. A photoresist layer is first spread on a semiconductor structure, and then using a photomask with a specially designed pattern exposes the photoresist layer. Next, the photoresist layer is developed to form a patterned photoresist layer. Thereafter, using the patterned photoresist layer as a mask, a trench is formed in the semiconductor structure by selective etching. In this case, the pattern of the photomask is formed as in the following steps. At first, a first pattern extending in a first direction and having a first side and a second side which is opposite to the first side is formed. Next, a second pattern extending in a second direction which is perpendicular to the first direction is formed in such a way that an end of the second pattern is connected with the first side of the first pattern. Thereafter, a concave edge is formed on the second side to substantially face the second pattern. Finally, a first fillet and a second fillet are formed at two corners intersected by the first and second pattern, respectively.

According to a second aspect of the present invention, a method for forming a mask used to improve the dimple phenomena comprises the following steps. A photoresist layer is first spread on a semiconductor structure, and then using a photomask with a specially designed pattern exposes the photoresist layer. Next, the photoresist layer is developed to form a patterned photoresist layer. Thereafter, using the patterned photoresist layer as a mask, a trench is formed in the semiconductor structure by selective etching. In this case, the pattern of the photomask is formed as in the following steps. At first, a first pattern extending in a first direction and having a first side and a second side which is opposite to the first side is formed. Next, a second pattern extending in a second direction which is perpendicular to the first direction is formed in such a way that an end of the second pattern is connected with the first side of the first pattern. The width of the first pattern is half of the width of the second pattern.

According to a third aspect of the present invention, a method for forming a mask used to improve the dimple phenomena comprises the following steps. A photoresist layer is first spread on a semiconductor structure, and then using a photomask with a specially designed pattern exposes the photoresist layer. Next, the photoresist layer is developed to form a patterned photoresist layer. Thereafter, using the patterned photoresist layer as a mask, a trench is formed in the semiconductor structure by selective etching. In this case, the pattern of the photomask is formed as in the following steps. At first, a first pattern extending in a first direction and having a first side and a second side which is opposite to the first side is formed. Next, a second pattern extending in a second direction which is perpendicular to the first direction is formed in such a way that an end of the second pattern is connected with the first side of the first pattern. The width of the first pattern is half of the width of the second pattern. Thereafter, a concave edge is formed on the second side to substantially face the second pattern. Finally, a first fillet and a second fillet are formed at two corners intersected by the first and second pattern, respectively.

BRIEF DESCRIPTION OF THE DRAWINGS

The above objective, feature and advantage of the invention will become more apparent from the following detailed descriptions of preferred embodiments taken in conjunction with the accompanying drawings, wherein.

DETAILED DESCRIPTION OF PREFERRED EMBODIMENTS

Preferred embodiments according to the invention will now be described in detail with reference to FIGS. 7(A) and 7(B) to 9(A) and 9(B). For the sake of simplicity, only the differences of the invention from the above-mentioned prior art are described below. Furthermore, referring to FIG. 1, in the embodiments according to the invention, the thickness of the pad oxide layer 2 is about 100 angstroms, the thickness of the silicon nitride layer 3 is about 1500 angstroms, the thickness of the mask oxide layer 4 is about 6000 angstroms, and the thickness of the photoresist layer is about 1 $\mu$m, for example.

First Embodiment

A first embodiment according to the invention is described in detail below with reference to FIGS. 7(A) and 7(B).

As mentioned above, in the prior art, serious dimples are developed at the dimple intersection points 221 after the deposition of the polysilicon layer 6 is completed because the dimple intersection points 221 are located farther from the sidewalls of the trench, as shown in FIG. 2(B). Therefore, the first embodiment according to the invention provides a method for shortening the distances between the dimple intersection points 221 and the sidewalls of the trench to improve the dimple phenomenon developed at the dimple intersection points 221.

Figure 7A:
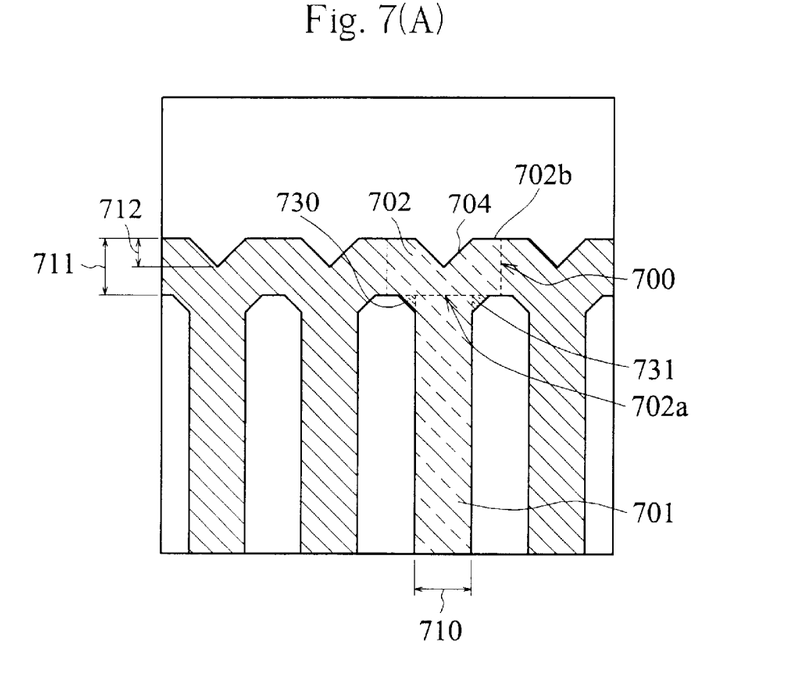
FIG. 7(A) is a plane view showing a photomask pattern for forming a trench according to a first embodiment of the invention.

FIG. 7(A) is a plane view showing a photomask pattern for forming a trench according to the first embodiment. In FIG. 7(A), similar to FIG. 2(A), the photomask pattern for forming a trench consists of a plurality of substantially T-shaped pattern cells 700. Each of the substantially T-shaped pattern cells 700 includes a stick portion 701 and a bar portion 702, in which a width 710 of the stick portion 701 is equal to the nominal width 711 of the bar portion 702 as well as the width 210 of the conventional stick portion 201 shown in FIG. 2(A). The bar portion 702 extends in a direction referred to as x while the stick portion 701 extends in another direction, referred to as y, being perpendicular to the x direction. Furthermore, the bar portion 702 has a first side 702a connected with the stick portion 701, and a second side 702b located opposite to the first side 702a. Moreover, the two adjacent T-shaped pattern cells 700 are connected at the respective bar portions 702. As mentioned above, in the high power ICs, each of the stick portions 701 of the photomask pattern for forming a trench according to the first embodiment is used to accommodate a MOS transistor cell, and the bar portions 702 are connected together to accommodate a gate bus, through which each of the MOS transistor cells is connected in parallel.

Moreover, in each of the T-shaped pattern cells 700, a concave edge 704, such as a triangle concave edge as shown in FIG. 7(A), is formed at the second side 702b of the bar portion 702. Each of the concave edges 704 substantially faces a corresponding stick portion 701, respectively. In the first embodiment, a depth 712 of the concave edge 704 is substantially equal to half of the nominal width 711 of the bar portion 702.

Figure 7B:
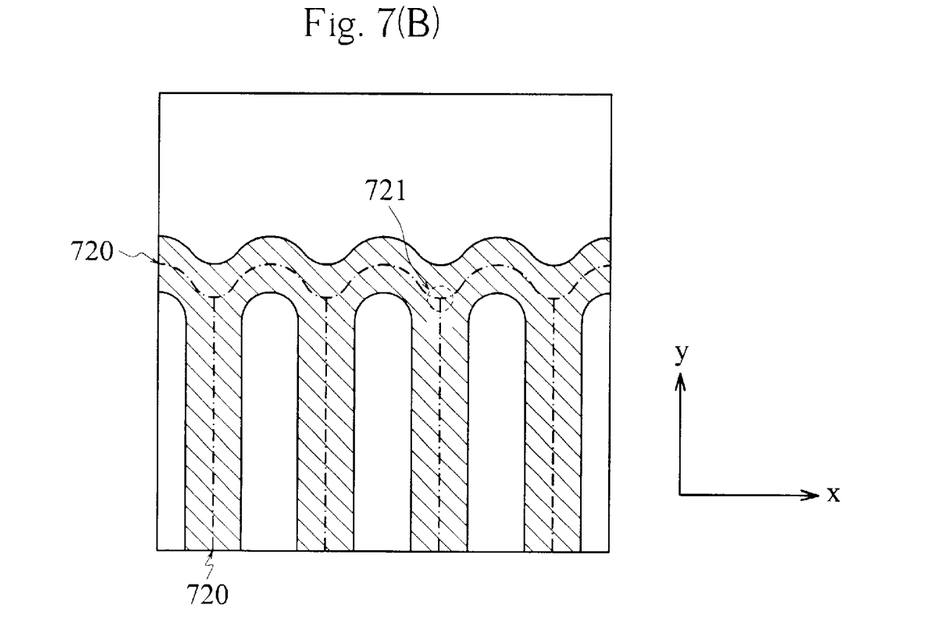
FIG. 7(B) is a plane view showing a patterned photoresist layer after being exposed and developed by using the photomask pattern shown in FIG. 7(A)

When a trench is formed using a photomask with the pattern shown in FIG. 7(A), however, the developed patterned photoresist layer is shown in FIG. 7(B), and the condition shown is due to the effects of optical interference and diffraction during the process of photolithography. More specifically, all of the originally sharp concerns of the trench pattern shown in FIG. 7(A) are dulled into rounded corners shown in FIG. 7(B).

Referring to FIG. 7(B), in the trench formed according to the first embodiment, each of the concave edges 704 shortens the distance between the first side 702a and the second side 702b of the bar portion 702. As a result, when a polysilicon layer 6 is filled into the trench formed according to the first embodiment, although a plurality of dimple lines 720 are still developed along the corresponding symmetric centers of the stick portions 701 and the bar portions 702, shallower dimples than the prior art dimples are developed at dimple intersection points 721. Furthermore, the depth of the dimples at the dimple intersection points 721 is substantially equal to that of the dimples along the dimple lines 720 since a distance between the dimple intersection points 721 and the sidewalls of the trench is substantially equal to that between any other points on the dimple lines and the sidewalls of the trench. In other words, the dimple phenomenon at the dimple intersection points 721 is greatly reduced according to the first embodiment. Consequently, the polysilicon layer 6 located in the vicinity of the dimple intersection points 721 is not completely removed, and a portion of the thin silicon oxide layer 5 located on the bottom surface of the semiconductor substrate 1 and a portion of the thin silicon oxide layer 5 covering the second side 702b of the trench are not exposed when the polysilicon layer 6 is etched back in such a way that the portion of the polysilicon layer 6 deposited on the mask oxide layer 4 is removed and a recess with a predetermined depth is formed within the trench. Therefore, the semiconductor structure of the trench formed according to the first embodiment is applicable for the fabrication of the high power ICs.

It should be understood that a first fillet 730 and a second fillet 731 are formed at two corners intersected by the stick portion 701 and the bar portion 702, respectively, in each of the T-shaped pattern cells 700 shown in FIG. 7(A) according to the first embodiment. The first and second fillets 730 and 731 primarily maintain the symmetry of each of the T-shaped pattern cells 700 to thereby prevent the effects of optical interference and diffraction raised from asymmetric patterns during the process of photolithography. However, the first and second fillet 730 and 731 are not necessary for improving the dimple phenomenon developed in the polysilicon layer. In addition, a depth 712 of the concave edge 704 is not limited to half of a nominal width 711 of the bar portion 702, and the shape of the concave edge 704 is not limited to a triangle, but may be, for example, a semicircle or a rectangle.

Second Embodiment

A second embodiment according to the invention is described in detail below with reference to FIGS. 8(A) and 8(B).

As mentioned above, in the prior art, serious dimples are developed at the dimple intersection points 221 after the deposition of the polysilicon layer 6 is completed because the dimple intersection points 221 are located farther from the sidewalls of the trench, as shown in FIG. 2(B). Therefore, the second embodiment according to the invention provides a method for shortening the distances between the dimple intersection points 221 and the sidewalls of the trench to thereby improve the dimple phenomenon developed at the dimple intersection points 221.

Figure 8A:
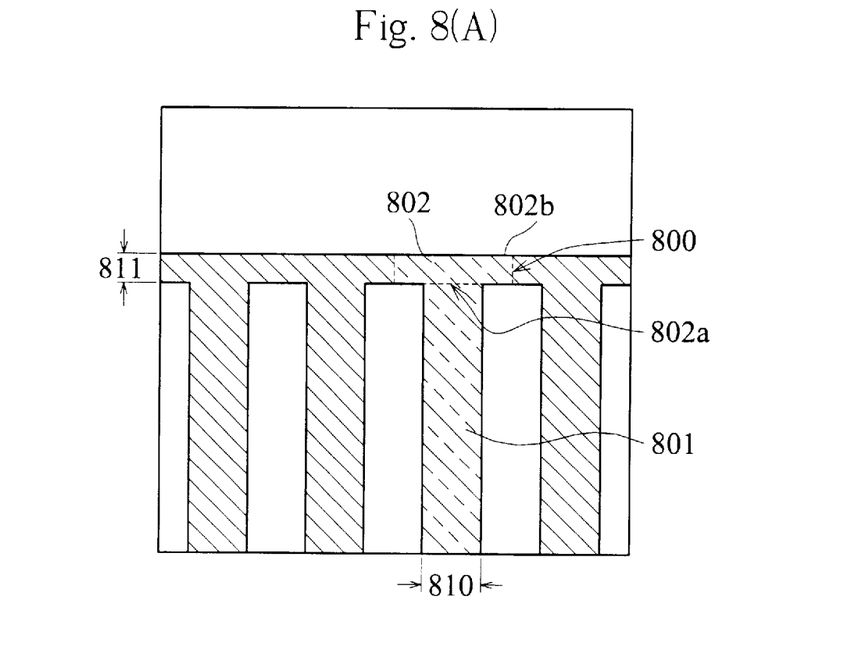
FIG. 8(A) is a plane view showing a photomask pattern for forming a trench according to a second embodiment of the invention.

FIG. 8(A) is a plane view showing a photomask pattern for forming a trench according to the second embodiment. In FIG. 8(A), similar to FIG. 2(A), the photomask pattern for forming a trench consists of a plurality of substantially T-shaped pattern cells 800. Each of the substantially T-shaped pattern cells 800 includes a stick portion 801 and a bar portion 802, in which a width 810 of the stick portion 801 is equal to the width 210 of the conventional stick portion 201 shown in FIG. 2(A). However, a width 811 of the bar portion 802 is equal to half of the width 810 of the stick portion 801. The bar portion 802 extends in a direction referred to as x while the stick portion 801 extends in another direction, referred to as y, being perpendicular to the x direction. Furthermore, the bar portion 802 has a first side 802a connected with the stick portion 801, and a second side 802b located opposite to the first side 802a. Moreover, the two adjacent T-shaped pattern cells 800 are connected at the respective bar portions 802. As mentioned above, in the high power ICs, each of the stick portions 801 of the photomask pattern for forming a trench according to the second embodiment is used to accommodate a MOS transistor cell, and the bar portions 802 are used to accommodate a gate bus, through which each of the MOS transistor cells is connected in parallel.

Figure 8B:
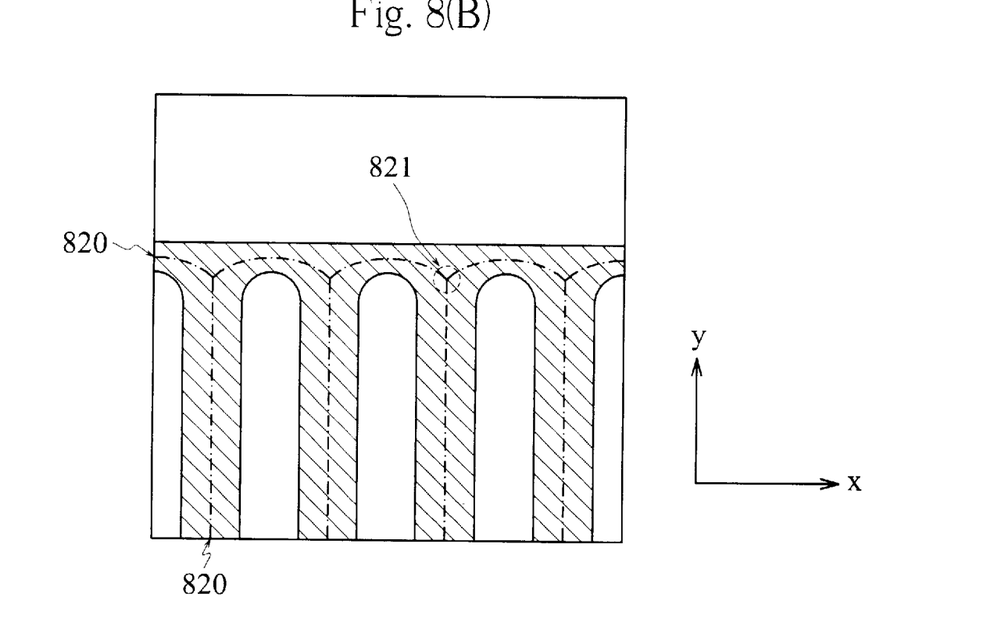
FIG. 8(B) is a plane view showing a patterned photoresist layer after being exposed and developed by using the photomask pattern shown in FIG. 8(A)

When a trench is formed using a photomask with the pattern shown in FIG. 8(A), however, the patterned photoresist layer after being developed is shown in FIG. 8(B), and the condition shown is due to the effects of optical interference and diffraction during the process of photolithography. More specifically, all of the originally sharp concerns of the trench pattern shown in FIG. 8(A) are dulled into rounded corners shown in FIG. 8(B).

Referring to FIG. 8(B), in the trench formed according to the second embodiment, the distance between the first side 802a and the second side 802b of the bar portion 802 is shortened because the width 811 of the bar portion 802 is equal to half of the width 211 of the prior art bar portion 202. As a result, when a polysilicon layer 6 is filled into the trench formed according to the first embodiment, although a plurality of dimple lines 820 are still developed along the corresponding symmetric centers of the stick portions 801 and the bar portions 802, the depth of the dimples located at the dimple intersection points 821 is greatly reduced. Furthermore, the depth of the dimples at the dimple intersection points 821 is substantially equal to or less than that of the dimples along the dimple lines 820 since the distance between the dimple intersection points 821 and the sidewalls of the trench is substantially equal to or less than that between any other points on the dimple lines and the sidewalls of the trench. In other words, the dimple phenomenon at the dimple intersection points 821 is greatly reduced according to the second embodiment. Consequently, a portion of the polysilicon layer 6 located in the vicinity of the dimple intersection points 821 is not completely removed, and a portion of the thin silicon oxide layer 5 located on the bottom surface of the semiconductor substrate 1 and a portion of the thin silicon oxide layer 5 covering the second side 802b of the trench are not exposed when the polysilicon layer 6 is etched back in such a way that the portion of the polysilicon layer 6 deposited on the mask oxide layer 4 is removed and a recess with a predetermined depth is formed within the trench. Therefore, the semiconductor structure of the trench formed according to the second embodiment is applicable for the fabrication of the high power ICs.

It should be understood that the width 811 of the bar portion 802 is not limited to half of the width 810 of the stick portion 801 in each of the T-shaped pattern cells 800 shown in FIG. 8(A) according to the second embodiment.

Third Embodiment

A third embodiment according to the invention is described in detail below with reference to FIGS. 9(A) and 9(B).

As mentioned above, in the prior art, the serious dimples are developed at the dimple intersection points 221 after the deposition of the polysilicon layer 6 is completed because the dimple intersection points 221 are located farther from the sidewalls of the trench, as shown in FIG. 2(B). Therefore, the first embodiment according to the invention provides a method for shortening the distances between the dimple intersection points 221 and the sidewalls of the trench to thereby improve the dimple phenomenon developed at the dimple intersection points 221.

Figure 9A:
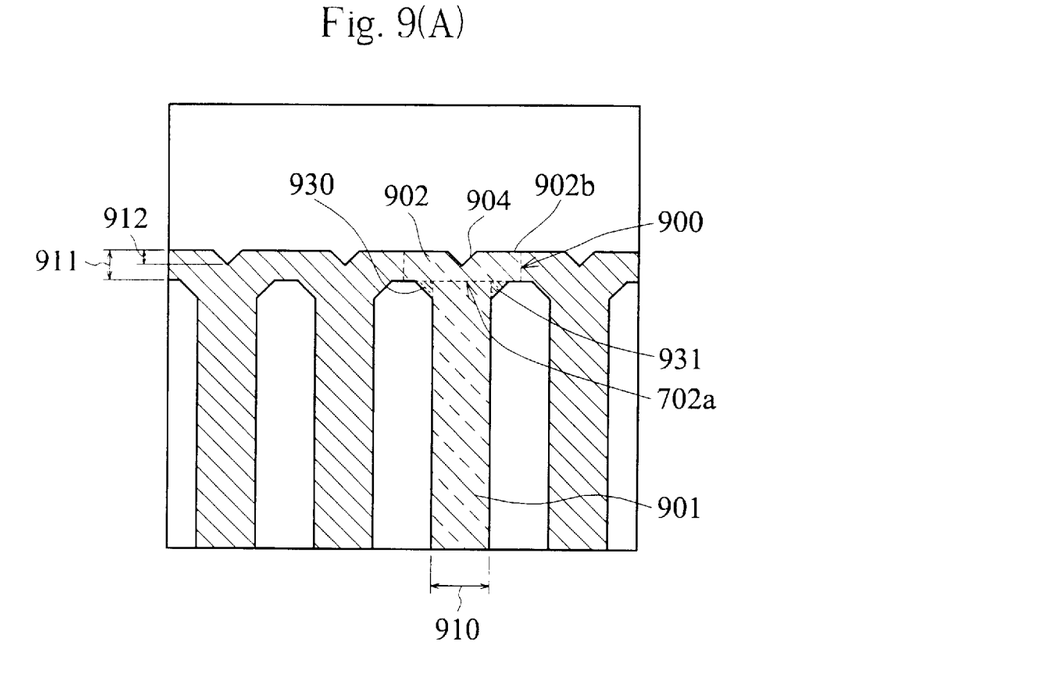
FIG. 9(A) is a plane view showing a photomask pattern for forming a trench according to a third embodiment of the invention.

FIG. 9(A) is a plane view showing a photomask pattern for forming a trench according to the third embodiment. In FIG. 9(A), similarly to FIG. 2(A), the photomask pattern for forming a trench consists of a plurality of substantially T-shaped pattern cells 900. Each of the substantially T-shaped pattern cells 900 includes a stick portion 901 and a bar portion 902, in which a nominal width 911 of the bar portion 902 is equal to half of a width 910 of the stick portion 901. The width 910 of the stick portion 901 is equal to the width 210 of the conventional stick portion 201 shown in FIG. 2(A). The bar portion 902 extends in a direction referred to as x while the stick portion 901 extends in another direction, referred to as y, being perpendicular to the x direction. Furthermore, the bar portion 902 has a first side 902a connected with the stick portion 901, and a second side 902b located opposite to the first side 902a. Moreover, two adjacent T-shaped pattern cells 900 are connected at the respective bar portions 902. As mentioned above, in the high power ICs, each of the stick portions 901 of the photomask pattern for forming a trench according to the first embodiment is used to accommodate a MOS transistor cell, and the bar portions 902 are connected together to accommodate a gate bus, through which each of the MOS transistor cells is connected in parallel.

Moreover, in each of the T-shaped pattern cells 900, a concave edge 904, such as a triangle concave edge as shown in FIG. 9(A), is formed at the second side 902b of the bar portion 902. Each of the concave edges 904 substantially faces a corresponding stick portion 901, respectively. In the third embodiment, a depth 912 of the concave edge 904 is substantially equal to half of the nominal width 911 of the bar portion 902.

Figure 9B:
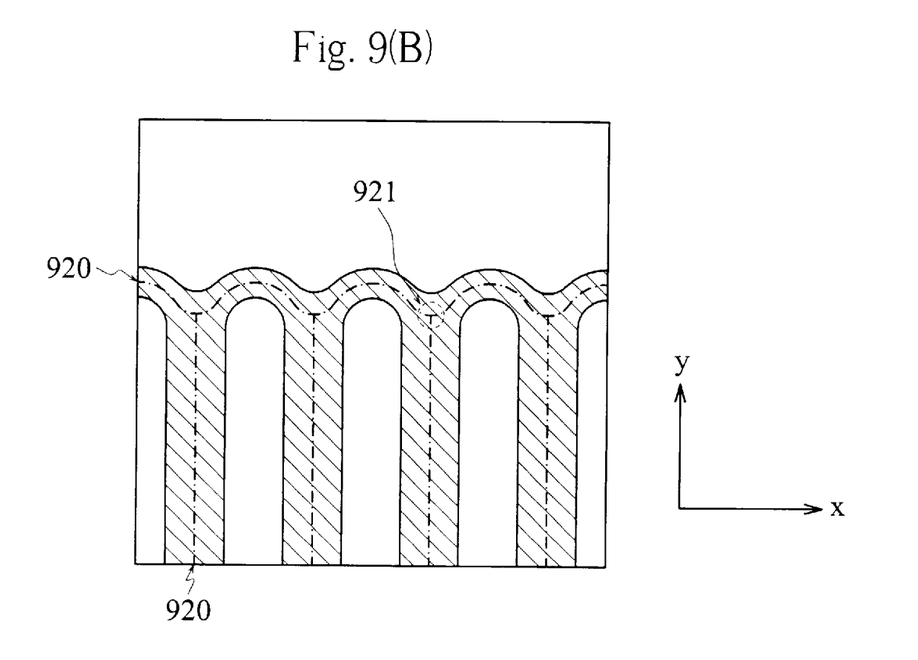
FIG. 9(B) is a plane view showing a patterned photoresist layer after being exposed and developed by using the photomask pattern shown in FIG. 9(A).

When a trench is formed using a photomask with the pattern shown in FIG. 9(A), however, the developed patterned photoresist film is shown in FIG. 9(B), and the condition shown is due to the effects of optical interference and diffraction during the process of photolithography. More specifically, all of the originally sharp concerns of the trench pattern shown in FIG. 9(A) are dulled into rounded corners shown in FIG. 9(B).

Referring to FIG. 9(B), in the trench formed according to the third embodiment, the distance between the first side 902a and the second side 902b of the bar portion 902 is shortened because the nominal width 911 of the bar portion 902 is equal to half of the width 211 of the prior art bar portion 202. In addition, each of the concave edges 904 further shortens the distance between the first side 902a and the second side 902b of the bar portion 902. As a result, when a polysilicon layer 6 is filled into the trench formed according to the third embodiment, although a plurality of dimple lines 920 are still developed along the corresponding symmetric centers of the stick portions 901 and the bar portions 902, the depth of the dimples located at dimple intersection points 921 is greatly reduced. Furthermore, the depth of the dimples at the dimple intersection points 921 is substantially equal to that of the dimples along the dimple lines 920 since a distance between the dimple intersection points 921 and the sidewalls of the trench is substantially equal to that between any other points on the dimple lines and the sidewalls of the trench. In other words, the dimple phenomenon at the dimple intersection points 921 is greatly reduced according to the first embodiment. Consequently, the polysilicon layer 6 located in the vicinity of the dimple intersection points 921 is not completely removed, and a portion of the thin silicon oxide layer 5 located on the bottom surface of the semiconductor substrate 1 and a portion of the thin silicon oxide layer 5 covering the second side 902b of the trench are not exposed when the polysilicon layer 6 is etched back in such a way that the portion of the polysilicon layer 6 deposited on the mask oxide layer 4 is removed and a recess with a predetermined depth is formed within the trench. Therefore, the semiconductor structure of the trench formed according to the third embodiment is applicable for fabrication of the high power ICs.

It should be understood that a first fillet 930 and a second fillet 931 are formed at two corners intersected by the stick portion 901 and the bar portion 902, respectively, in each of the T-shaped pattern cells 900 shown in FIG. 9(A) according to the third embodiment. The first and second fillets 930 and 931 primarily maintain the symmetry of each of the T-shaped pattern cells 900 to thereby prevent the effects of optical interference and diffraction raised from asymmetric patterns during the process of photolithography. However, the first and second fillet 930 and 931 are not necessary for improving the dimple phenomenon developed in the polysilicon layer. In addition, the depth 912 of the concave edge 904 is not limited to half of the nominal width 911 of the bar portion 902, and the shape of the concave edge 904 is not limited to a triangle, but may be, for example, a semicircle or a rectangle.

Accordingly, the invention has disclosed a method for improving the dimple phenomena of a polysilicon layer deposited on the trench, thereby greatly reducing a depth of dimples developed at intersection points of dimple lines. It is very easy to fabricate semiconductor trench structures, which are applicable to high power integrated circuits.

While the invention has been described by way of example and in terms of the preferred embodiment, it is to be understood that the invention is not limited to the disclosed embodiment. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method for improving the dimple phenomena of a polysilicon film deposited on a trench, comprising the following steps:

preparing a semiconductor structure;

spreading a photoresist layer on the semiconductor structure;

forming on a photomask a first pattern extending in a first direction and having a first side and a second side which is opposite to the first side;

forming on the photomask a second pattern extending in a second direction which is perpendicular to the first direction in such a way that an end of the second pattern is connected with the first side of the first pattern;

forming on the second side a concave edge which substantially faces the second pattern;

exposing the photoresist layer using the photomask;

developing the photoresist layer to form a patterned photoresist layer; and selectively etching the semiconductor structure by using the patterned photoresist layer as a mask to form a trench in the semiconductor structure.

2. A method according to claim 1, wherein the first pattern has a nominal width and a depth of the concave edge is substantially equal to half of the nominal width.

3. A method according to claim 2, further comprising a step of forming a first fillet and a second fillet at two corners constructed by the first pattern and the second pattern, respectively, after said step of forming the second pattern.

4. A method according to claim 1, wherein the concave edge is triangular.

5. A method according to claim 1, wherein the concave edge is semicircular.

6. A method according to claim 1, wherein the concave edge is rectangular.

7. A method according to claim 1, wherein the nominal width of the first pattern is less than a width of the second pattern.

8. A method according to claim 7, wherein the nominal width of the first pattern is equal to half of the width of the second pattern.

9. A method according to claim 1, wherein said step of preparing the semiconductor structure comprises a step of forming a semiconductor multi-layer structure.

10. A method according to claim 9, wherein said step of forming the semiconductor multi-layer structure comprises:

preparing a semiconductor substrate;

forming a pad oxide layer on the semiconductor substrate;

forming a silicon nitride layer on the pad oxide layer; and forming a mask oxide layer on the silicon nitride layer.

11. A method according to claim 10, wherein the semiconductor is made of silicon.

12. A method for improving the dimple phenomena of a polysilicon film deposited on a trench, comprising the following steps:

preparing a semiconductor structure;

spreading a photoresist layer on the semiconductor structure;

forming on a photomask a first pattern extending in a first direction and having a first side and a second side which is opposite to the first side;

forming on the photomask a second pattern extending in a second direction which is perpendicular to the first direction in such a way that an end of the second pattern is connected with the first side of the first pattern and a width of the second pattern is larger than a width of the first pattern;

exposing the photoresist layer by using the photomask;

developing the photoresist layer to form a patterned photoresist layer; and selectively etching the semiconductor structure by using the patterned photoresist layer as a mask to form a trench in the semiconductor structure.

13. A method according to claim 12, wherein the width of the first pattern is substantially equal to half of the width of the second pattern.

14. A method according to claim 12, further comprising a step of forming on the second side a concave edge which substantially faces the second pattern after said step of forming the second pattern.

15. A method according to claim 14, wherein a depth of the concave edge is substantially equal to half of the width of the first pattern.

16. A method according to claim 12, further comprising a step of forming a first fillet and a second fillet at two corners constructed by the first pattern and the second pattern, respectively, after said step of forming the second pattern.

17. A method according to claim 14, wherein the concave edge is triangular.

18. A method according to claim 14, wherein the concave edge is semicircular.

19. A method according to claim 14, wherein the concave edge is rectangular.

20. A method according to claim 12, wherein said step of preparing the semiconductor structure comprises:

preparing a semiconductor substrate made of silicon;

forming a pad oxide layer on the semiconductor substrate;

forming a silicon nitride layer on the pad oxide layer; and forming a mask oxide layer on the silicon nitride layer.

* * * * *